(12) United States Patent
Adalsteinsson et al.

(10) Patent No.: US 10,197,646 B2
(45) Date of Patent: Feb. 5, 2019

(54) DECOUPLING OF PARALLEL TRANSMISSION ARRAYS IN MAGNETIC RESONANCE IMAGING

(71) Applicants: Elfar Adalsteinsson, Belmont, MA (US); Luca Daniel, Cambridge, MA (US); Bastien Guerin, Cambridge, MA (US); Boris Keil, Charleston, MA (US); Zohaib Mahmood, Cambridge, MA (US); Markus Vester, Nürnberg (DE); Lawrence Wald, Cambridge, MA (US)

(72) Inventors: Elfar Adalsteinsson, Belmont, MA (US); Luca Daniel, Cambridge, MA (US); Bastien Guerin, Cambridge, MA (US); Boris Keil, Charleston, MA (US); Zohaib Mahmood, Cambridge, MA (US); Markus Vester, Nürnberg (DE); Lawrence Wald, Cambridge, MA (US)

(73) Assignees: Siemens Aktiengesellschaft, München (DE); Massachusetts Institute of Technology, Cambridge, MA (US); Massachusetts General Hospital Corporation, Boston, MA (US)

(*) Notice: Subject to any disclaimer, the term of this patent is extended or adjusted under 35 U.S.C. 154(b) by 851 days.

(21) Appl. No.: 14/705,576

(22) Filed: May 6, 2015

(65) Prior Publication Data
US 2015/0323623 A1    Nov. 12, 2015

Related U.S. Application Data

(60) Provisional application No. 61/989,095, filed on May 6, 2014.

(51) Int. Cl.
*G01R 33/36*    (2006.01)
*G01R 33/34*    (2006.01)
(Continued)

(52) U.S. Cl.
CPC ..... *G01R 33/365* (2013.01); *G01R 33/34076* (2013.01); *G01R 33/34092* (2013.01);
(Continued)

(58) Field of Classification Search
CPC .......... G01R 33/3657; G01R 33/34092; G01R 33/385; G01R 33/34076; G01R 33/5612
(Continued)

(56) References Cited

U.S. PATENT DOCUMENTS

2007/0273377 A1* 11/2007 Yang ................. G01R 33/3415
324/318
2009/0076377 A1* 3/2009 Findekelee .......... G01R 33/365
600/422

OTHER PUBLICATIONS

Lee et al. "Decoupled Circular-Polarized Dual-Head Volume Coil Pair for Studying Two Interacting Human Brains with Dyadic fMRI", Magnetic Resonance in Medicine 68:1087-1096, 2012.*
(Continued)

*Primary Examiner* — Melissa Koval
*Assistant Examiner* — Courtney McDonnough
(74) *Attorney, Agent, or Firm* — Lempia Summerfield Katz LLC (57) ABSTRACT

A magnetic resonance imaging (MRI) system includes a plurality of transmitters to generate a parallel transmission radio frequency (RF) pulse, an array of coils coupled to the plurality of transmitters to apply the parallel transmission RF pulse to a subject, and a decoupling system connected to the plurality of transmitters and the array of coils. The decoupling system includes a plurality of hybrid couplers, each hybrid coupler of the plurality of hybrid couplers being coupled to a respective pair of the plurality of transmitters and to a respective pair of the array of coils. The plurality of hybrid couplers are configured to diagonalize an impedance matrix of the plurality of coils.

20 Claims, 7 Drawing Sheets

(51) Int. Cl.
*G01R 33/385* (2006.01)
*G01R 33/561* (2006.01)
*G01R 33/3415* (2006.01)

(52) U.S. Cl.
CPC ....... *G01R 33/3657* (2013.01); *G01R 33/385* (2013.01); *G01R 33/5612* (2013.01); *G01R 33/3415* (2013.01)

(58) Field of Classification Search
USPC .......................................................... 324/322
See application file for complete search history.

(56) References Cited

OTHER PUBLICATIONS

A Practical Technique for Designing Multiport Coupling NetworksW. Preston Geren, Clifford R. Curry and Jonny AndersonIEEE Transactions on Microwave Theory and Techniques, vol. 44, No. 3, Mar. 1996p. 364 to 371; 1996.

Alagappan, V., et al. "An 8 channel transmit coil for transmit SENSE at 3T." Proceedings of the 14th Annual Meeting of ISMRM, Seattle, WA, USA. 2006.

Alagappan, Vijayanand, et al. "Degenerate mode band-pass birdcage coil for accelerated parallel excitation." Magnetic in resonance medicine 57.6 (2007): 1148-1158.

Allen, Jeffery C., and John W. Rockway. "Characterizing optimal multiport matching transformers." Circuits, Systems, and Signal Processing 31.4 (2012): 1513-1534.

Andersen, J. Bach, and Henrik Hass Rasmussen. "Decoupling and descattering networks for antennas." IEEE Transactions on Antennas and Propagation 24 (1976): 841-846.

Direct Single Frequency Synthesis from a Prescribed Scattering MatrixD.C. Youlaire Transactions on Circuit Theoryp. 340 to 344; 1959.

Duensing, G. R., H. R. Brooker, and J. R. Fitzsimmons. "Maximizing signal-to-noise ratio in the presence of coil coupling." Journal of Magnetic Resonance, Series B 111.3 (1996): 230-235.

Hui, Hon Tat. "Decoupling methods for the mutual coupling effect in antenna arrays: a review." Recent Patents on Engineering 1.2 (2007): 187-193.

Jevtic, Jovan. "Ladder networks for capacitive decoupling in phased-array coils." Proceedings of the 9th Annual Meeting of ISMRM, Glasgow, Scotland. vol. 17. 2001.

Kozlov, Mikhail, Richard Turner, and Nikolai Avdievich. "Investigation of decoupling between MRI array elements." Microwave Conference (EuMC), 2013 European. IEEE, 2013.

Lee, Ray F., Randy O. Giaquinto, and Christopher J. Hardy. "Coupling and decoupling theory and its application to the MRI phased array." Magnetic resonance in medicine 48.1 (2002): 203-213.

Mahmood, Z., et al. "Design of a robust decoupling matrix for high field parallel transmit arrays." Proceedings of the 22nd Annual Meeting and Exhibition of ISMRM, Milan, Italy. 2014.

Mahmood, Zohaib, et al. "An automated framework to decouple pTx arrays with many channels." Proceedings of 21st Annual Meeting of ISMRM, Salt Lake City, Utah, USA. 2013.

Roemer, Peter B., et al. "The NMR phased array." Magnetic resonance in medicine 16.2 (1990): 192-225.

Stang, P. P., et al. "Active coil decoupling by impedance synthesis using frequency-offset cartesian feedback." Proceedings of 19th Annual Meeting and Exhibition of ISMRM, Montreal, QC, Canada. 2011.

Steyskal, Hans, and Jeffrey S. Herd. "Mutual coupling compensation in small array antennas." IEEE Transactions on Antennas and Propagation 38 (1990).

Vernickel, P., et al. "Active digital decoupling for multi-channel transmit MRI Systems." Proceedings of the Joint Annual Meeting of ISMRM-ESMRMB, Berlin, Germany. 2007.

Wang, Jianmin. "A novel method to reduce the signal coupling of surface coils for MRI." Proceedings of the 4th Annual Meeting of ISMRM. 1996.

Wu, Bing, et al. "Interconnecting L/C components for decoupling and its application to low-field open MRI array." Concepts in Magnetic Resonance Part B: Magnetic Resonance Engineering 31.2 (2007): 116-126.

* cited by examiner

DECOUPLING OF PARALLEL TRANSMISSION ARRAYS IN MAGNETIC RESONANCE IMAGING

CROSS-REFERENCE TO RELATED APPLICATION

This application claims the benefit of the U.S. provisional application entitled "General Framework to Decouple Parallel Transmission RF Arrays," filed May 6, 2014, and assigned Ser. No. 61/989,095, the entire disclosure of which is hereby incorporated by reference.

STATEMENT REGARDING FEDERALLY SPONSORED RESEARCH OR DEVELOPMENT

This invention was made with government support under Grant Nos. R01 EB006847 and R01 EB007942 awarded by the National Institutes of Health (NIH). The government has certain rights in the invention.

FIELD

The disclosure relates generally to magnetic resonance imaging (MRI) systems and, more particularly, to MRI systems having parallel transmission arrays.

BACKGROUND

Magnetic resonance imaging (MRI) is a medical imaging technique in widespread use for viewing the structure and function of the human body. MRI systems provide soft-tissue contrast, such as for diagnosing many soft-tissue disorders. MRI systems generally implement a two-phase method. The first phase is the excitation phase, in which a magnetic resonance signal is created in the subject with a main, polarizing magnetic field, $B_0$, and a radio frequency (RF) excitation field, $B_1^+$. The second phase is the acquisition phase, in which the system receives an electromagnetic signal emitted as the precessing nuclei induce a voltage in a receive coil via the Faraday effect. After the excitation and precession phase, the nuclear magnetic moments relax back into alignment with the main magnetic field with the characteristic time T1 (e.g., about 1 second in the brain). These two phases are repeated pair-wise to acquire enough data to construct an image.

Higher magnetic field strength scanners have been recently used to improve image signal-to-noise ratio and contrast. However, a spatial variation in the magnitude of the RF excitation magnetic field, $B_1^+$, occurs with main magnetic field strengths of, for example, 7 Tesla. This undesirable non-uniformity in the excitation across the region of interest is commonly referred to as "center brightening," "$B_1^+$ inhomogeneity" or "flip angle inhomogeneity."

Newer-generation MRI systems have the capability of generating RF pulses with a spatially tailored excitation pattern to mitigate the $B_1^+$ inhomogeneity inherent to high magnetic fields by exciting a spatial inverse of the inhomogeneity. In these systems, multiple radio-frequency pulse trains are transmitted in parallel over independent radio-frequency transmit channels, e.g., the individual rods of a whole-body antenna. This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes, and minimization and management of power deposition in tissue as measured by specific absorption rate (SAR).

Unfortunately, in parallel transmission systems, power from one channel may be coupled, i.e., partially delivered, to other channels. Such coupling interferes with the incident waves of the pulses of the other channels. Coupling also reduces the power efficiency of the MRI system, insofar as power coupled from one channel to another is redirected to resistive loads for dissipation in order to protect the power amplifiers. This power is therefore lost and cannot be used to excite the MRI signal.

SUMMARY

Decoupling systems and methods are provided for an array of coils of a parallel transmission magnetic resonance imaging (MRI) system. The decoupling is provided via a plurality of hybrid couplers. The hybrid couplers are configured to diagonalize an impedance matrix of the plurality of coils.

In accordance with one aspect, an MRI system includes a plurality of transmitters to generate a parallel transmission radio frequency (RF) pulse, an array of coils coupled to the plurality of transmitters to apply the parallel transmission RF pulse to a subject, and a decoupling system connected to the plurality of transmitters and the array of coils. The decoupling system includes a plurality of hybrid couplers, each hybrid coupler of the plurality of hybrid couplers being coupled to a respective pair of the plurality of transmitters and to a respective pair of the array of coils. The plurality of hybrid couplers are configured to diagonalize an impedance matrix of the plurality of coils.

In accordance with another aspect, a method of decoupling an array of coils of a parallel transmission MRI system includes producing an excitation pulse for each coil of the array of coils, amplifying each excitation pulse with a respective amplifier of a plurality of amplifiers, and passing each amplified excitation pulse through a decoupling system to decouple the array of coils, the decoupling system including a plurality of hybrid couplers. Each hybrid coupler of the plurality of hybrid couplers is coupled to a respective pair of the plurality of amplifiers and to a respective pair of the array of coils. Passing each amplified excitation pulse includes diagonalizing, with the plurality of hybrid couplers, an impedance matrix of the plurality of coils.

In accordance with yet another aspect, an MRI system includes a plurality of transmitters to generate a parallel transmission radio frequency (RF) pulse, an array of coils coupled to the plurality of transmitters to apply the parallel transmission RF pulse to a subject, and a decoupling system connected to the plurality of transmitters and the array of coils. The decoupling system includes first and second sets of hybrid couplers, each hybrid coupler of the first and second sets of hybrid couplers being coupled to a respective pair of the plurality of transmitters and to a respective pair of the array of coils, and a plurality of reactive elements coupling the first set of hybrid couplers to the second set of hybrid couplers. The first set of hybrid couplers are configured to diagonalize a reactive part of an impedance matrix of the plurality of coils. The plurality of reactive elements are configured to cancel reactance remaining after diagonalization by the first set of hybrid couplers. The second set of hybrid couplers are configured to diagonalize resistance remaining after cancellation of the reactance.

In accordance with yet another aspect, a method of configuring a parallel transmission MRI system with a decoupling system for an array of coils of the parallel transmission MRI system includes obtaining an impedance matrix for the array of coils without the decoupling system, determining, with a processor, a first circuit block that diagonalizes a reactive component of the impedance matrix, determining, with the processor, rotation angles of a first set of hybrid couplers to implement the first circuit block, determining, with the processor, a second circuit block that diagonalizes a resistive component of the impedance matrix after diagonalization of the reactive component, and determining, with the processor, rotation angles of a second set of hybrid couplers to implement the second circuit block.

DETAILED DESCRIPTION OF THE DRAWINGS

The automated configuration of a parallel transmission (pTx) magnetic resonance imaging (MRI) system is described. A decoupling system of the MRI system may be configured to decouple a coil array of the parallel transmission MRI system. The decoupling system may be connected to the coil array (e.g., interfaced between power amplifiers and coils) to reduce or eliminate the transmission of power from one channel to other channels of the parallel transmission MRI system. With the resulting improved power efficiency, the MRI system may be capable of lower operational power levels. In some cases, the lower operational power levels may lead to compatibility with lower cost power amplifiers and may otherwise realize cost decreases due to lower power demand during operation.

The decoupling system includes a plurality of hybrid couplers to diagonalize an impedance matrix of the coil array. Each hybrid coupler is coupled to a respective pair of transmitters and to a respective pair of coils of the coil array. The decoupling provided by the hybrid couplers may ensure that all (or nearly all) transmission power is directed forward to the patient, despite mixing the input signals. The disclosed embodiments may be used to configure the hybrid couplers and other components of the decoupling system.

The decoupling matrix optimized by the disclosed embodiments allows the MRI system to continue to take advantage of the degrees of freedom presented by the parallel transmission architecture. For example, the coupling of the coils of the array need not be addressed through preliminary pulse design adjustments. The MRI system may thus retain the increased flexibility of the parallel transmission architecture to generate a variety of magnetization profiles relative to conventional single-channel RF systems.

The disclosed embodiments enable a decoupling system to be configured or customized for a specific coil array. The disclosed embodiments may thus be useful in connection with a variety of different types or designs of coil arrays. The disclosed embodiments are independent of the geometrical configuration of the coils, and thus useful in connection with a wide variety of coil types. The disclosed embodiments are described below in connection with two- and four-channel coil arrays with the understanding that the disclosed embodiments are not limited to decoupling a specific number of channels or a particular type of coil array.

The automation of the disclosed embodiments may address the challenge presented by parallel transmission systems having a large or considerable number of array elements. The disclosed embodiments may be used to automatically design or define a decoupling matrix for parallel transmission architectures with many channels. The automation may avoid having to manually tune a large number of elements in, for example, a ladder network. Such tuning may be particularly challenging due to high sensitivity levels arising from the large number of elements in the network.

The disclosed methods and systems are well-suited for use with a variety of different pulse sequences, including, for example, RF shimming, spoke design, spiral trajectory excitation, spatially selective excitation, uniform volume excitation, spatial-domain design for small flip angle approximation, linear class of large tip angle pulses, and optimal control methods.

Figure 1:
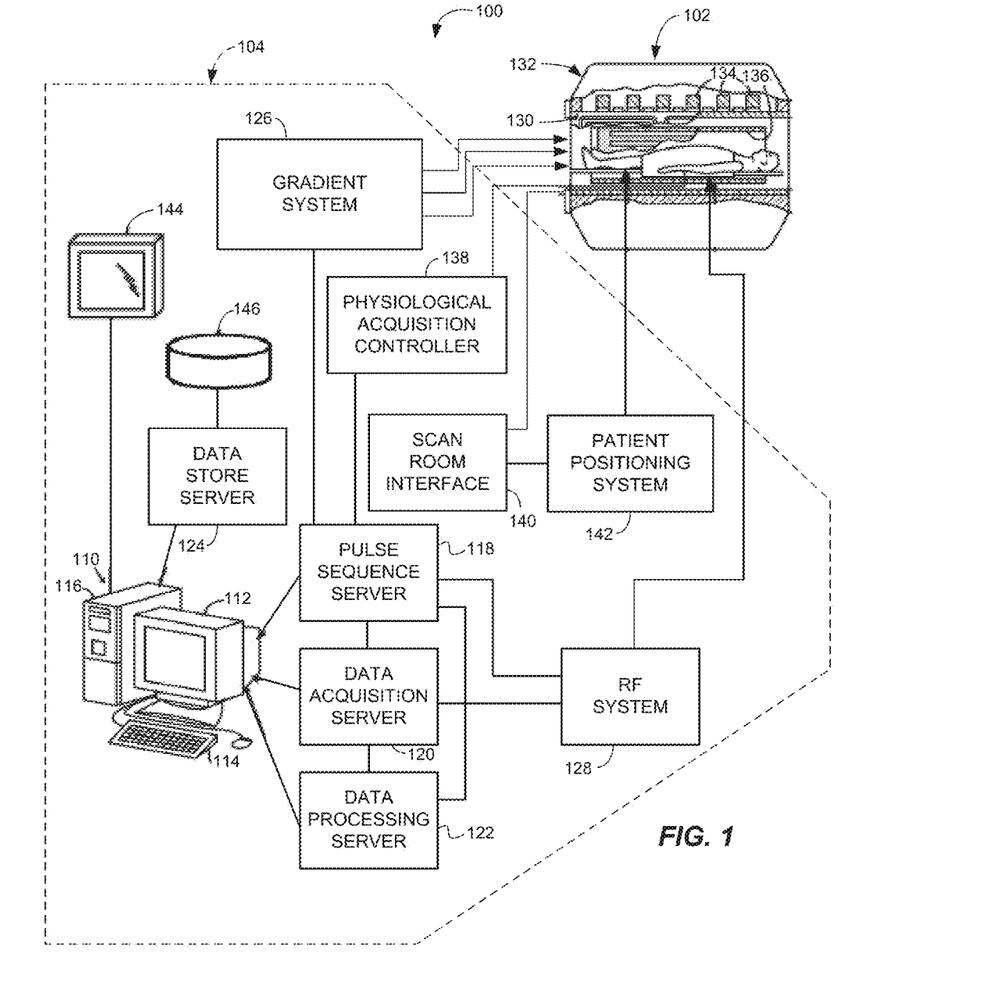
FIG. 1 is a block diagram of one embodiment of a magnetic resonance imaging (MRI) system configured in accordance with one embodiment.

Turning now to the drawing figures, FIG. 1 depicts a magnetic resonance imaging ("MRI") system 100 configured in accordance with several aspects of the disclosure. The MRI system 100 generally includes a scanner or data acquisition unit 102 and a control system 104 for directing the operation of the scanner 102. In an excitation phase of operation, the data acquisition unit 102 creates a magnetic resonance signal by subjecting a subject to a main magnetic field, B0, to align the individual magnetic moments, or spins, of the nuclei in the tissue with the axis of the polarizing field (conventionally, the z-axis). The main magnetic field also causes the magnetic moments to resonantly precess about the axis at their characteristic Larmor frequency. The data acquisition unit 102 then subjects the tissue to a radio frequency (RF) excitation pulse, B1, with a frequency near the Larmor frequency, so that a magnetic field in the x-y plane re-orients, flips, or tips the net aligned moment, Mz, into or toward the x-y plane, producing a net transverse magnetic moment Mxy, the so-called transverse spin magnetization. The excitation phase is generally tailored to localize the excitation pulse to a specific region within the subject, such as a 3D slab or a relatively thin 2D slice. In a subsequent acquisition phase of operation, the data acquisition unit 102 encodes the localized region in all three dimensions for a 3D slab or only in-plane for a thin slice. The region to be imaged may be scanned by a sequence of measurement cycles in which magnetic field gradients ($G_x$, $G_y$, and $G_z$) vary according to the particular localization method being used. Tailored RF pulses may be used to localize the excitations.

The control system 104 includes a workstation 110 having one or more output interfaces 112 (e.g., display interfaces) and one or more input interfaces (e.g., keyboard) 114. The workstation 110 includes a computer (or processor thereof)

116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers, including, in this example, a pulse sequence server 118, a data acquisition server 120, a data processing server 122, and a data store server 124. The workstation 110 and the servers 118, 120, 122 and 124 may communicate with each other via any desired communication technique, protocol, or standard. The servers 118, 120, 122, and 124 may correspond with respective services provided by a single workstation, such as the workstation 110. The components of the control system 104 may be coupled to one another via a data bus or network (not shown) and need not be connected via respective, dedicated communication lines as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The pulse sequence server 118 functions in response to instructions downloaded from the workstation 110 to operate a gradient system 126 and a radio frequency ("RF") system 128. Scan sequences containing data indicative of the RF pulses and gradients may be stored in a library or other memory of the pulse sequence server 118 or other component of the control system 104. Gradient waveforms to perform the prescribed scan are produced and applied to the gradient system 126 that excites gradient coils in a gradient coil assembly 130 to produce the magnetic field gradients $G_x$, $G_y$, and $G_z$ used for position-encoding MR signals. The gradient coil assembly 130 forms part of a magnet assembly 132 that includes an annular or other polarizing magnet 134 and a whole-body RF coil array 136. In some cases, the whole-body RF coil array 136 is constructed in the form of a so-called birdcage antenna and has a number of individual antenna rods which run parallel to the patient tunnel and uniformly distributed in a circumferential arrangement around the patient tunnel. The individual antenna rods may be capacitively coupled to one another in a ring shape at one end of the birdcage antenna. A depiction of an exemplary birdcage antenna is shown and described in U.S. Patent Publication No. 2010/0327868 ("SAR Calculation for Multichannel MR Transmission Systems"), the entire disclosure of which is incorporated by reference.

RF excitation waveforms are applied to the RF coil array 136 by the RF system 128 to perform a selected magnetic resonance pulse sequence. Responsive MR signals detected by the RF coil array 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil array 136 or to one or more local coils or coil arrays. As described below, the RF transmitter includes a plurality of transmission channels to produce RF pulses formed via the superimposition of the RF B1+ fields generated by each transmission channel.

The RF system 128 also includes one or more RF receiver channels. Each RF receiver channel includes an RF amplifier that amplifies the MR signal received by the coil to which it is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals are typically used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 passes the acquired MR data to the data processor server 122. In scans that require information derived from acquired MR data to control the further performance of the scan, the data acquisition server 120 may be programmed to produce such information and convey it to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices. Also, navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 may acquire MR data and process the MR data in real-time to produce information used to control the scan.

The data processing server 122 receives MR data from the data acquisition server 120 and processes the MR data in accordance with instructions downloaded from the workstation 110. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, rendering, or other visualization processes.

Images reconstructed by the data processing server 122 are conveyed back to the workstation 110 for storage and/or display. Real-time images may be stored in a database memory cache (not shown) from which they may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
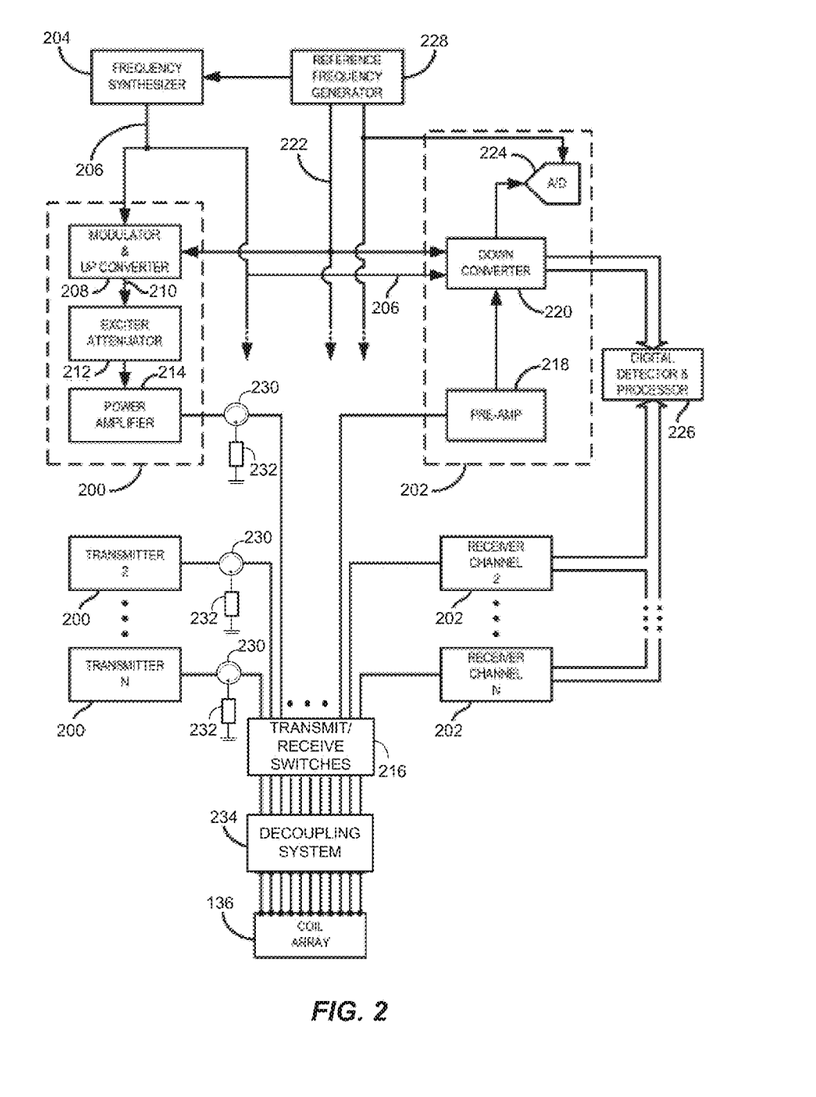
FIG. 2 is a block diagram of an RF system and other components of the MRI system of FIG. 1 to depict a parallel transmission architecture of the MRI system configured in accordance with one embodiment.

Referring now to FIG. 2, the RF system 128 and other components of the system 100 are shown in greater detail. The whole body coil array 136 generally includes a plurality of coil elements that can be separately driven by a plurality of RF transmitters 200 to produce a desired RF field-of-excitation. Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to acquire the MR signals. A variety of different coil array structures may be used as part of the system 100 of FIG. 1.

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where its amplitude is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N (e.g., 16) of the transmitters 200 are employed and connected through a corresponding number N of the transmit/receive switches 216 to a corresponding number N of the coil elements in the RF coil array 136. Other transmitter arrangements may be used.

The signal produced by the subject is picked up by the coil array 200 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital ("A/D") converter 224 which samples and digitizes the analog signal and applies it to a digital detector and signal processor 226. The digital detector and signal processor 226 produces 16-bit in-phase (I) values and 16-bit quadrature (Q) values corresponding to the received signal, but other formats may be used. The resulting stream of digitized I and Q values of the received signal are output to the data acquisition server 120 (FIG. 1). The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure.

When the $B_1$ field is not produced, the pulse sequence server 118 directs the transmit/receive switches 216 to connect each of the N receive channels to the respective N coil elements. Signals produced by the excited spins in the subject are picked up and separately processed as described above.

Circulators 230 may be incorporated into each transmit channel. In the embodiment of FIG. 2, each transmit channel includes a respective one of the circulators 230 connected between the power amplifier 214 and the transmit/receive switch 216. The circulators 230 are directed to protecting the power amplifiers 214 from power reflected back from the coil array 136 or coupled from one of the other channels. Each circulator 230 is configured to redirect such reflected or coupled power to a grounded, resistive load 232 for dissipation.

The RF system 128 includes a decoupling system 234 to remove or reduce inductive, capacitive, and/or resistive coupling between the coils of the coil array 136. The decoupling system 234 is connected to the coil array 136 and the transmitters 200. In the example shown in FIG. 2, the decoupling system 234 is disposed between the transmit/receive switches 216 and the coil array 136 to reflect the possibility that, in some embodiments, the decoupling system 234 may connect both the transmit and receive channels of the RF system 128 to the coil array 136. Other connection arrangements may be used, including, for instance, ones in which the decoupling system 234 connects only the transmit channels to the coil array 136. Despite the decoupling of the coil array 136 provided by the decoupling system 234, the circulators 230 may be used to provide additional protection for the transmitters 200 and the power amplifiers 214 thereof.

The decoupling system 234 is configured in accordance with a decoupling matrix to attain a decoupled operating condition for the coil array 136. The impedance matrix of a coupled N-channel coil array is described by a dense symmetric complex matrix $Z_C = R_C + jX_C$. The off-diagonal elements of $Z_C$, ($i \neq j$) indicate the coupling between the elements i and j of the array. Because all of the transmitters 200 are independent, the source impedance matrix is diagonal, with the output impedance of the corresponding power amplifier 214 as the diagonal elements (e.g., 50Ω). The decoupled condition may thus include or involve converting the impedance matrix of the load seen by the transmitters 200 (e.g., the power amplifiers 214) into a diagonal matrix with impedance values matched to those of the transmitters 200 (e.g., 50Ω). In some cases, the decoupling system 234 may not reach the decoupling condition exactly.

The decoupling system 234 may include a set of distributed transmission lines and a set of reactive elements (e.g., capacitors and inductors). In some cases, the decoupling system 234 only includes reactive elements and distributed transmission line components. A low insertion loss may thus be achieved. The transmission lines and reactive elements are arranged in a network between the nodes. For example, each respective pair of nodes associated with the transmitters 200 and the coil array 236 may be coupled to each other by one or more respective transmission lines and one or more respective reactive elements. In some cases, some of the pairs of nodes are not connected via the decoupling system 234. For example, some pairs may not be connected by the decoupling system 234 if the pair is already sufficiently decoupled. Further details regarding exemplary configurations of the decoupling system 234 are provided below in connection with FIGS. 4-7.

Figure 3:
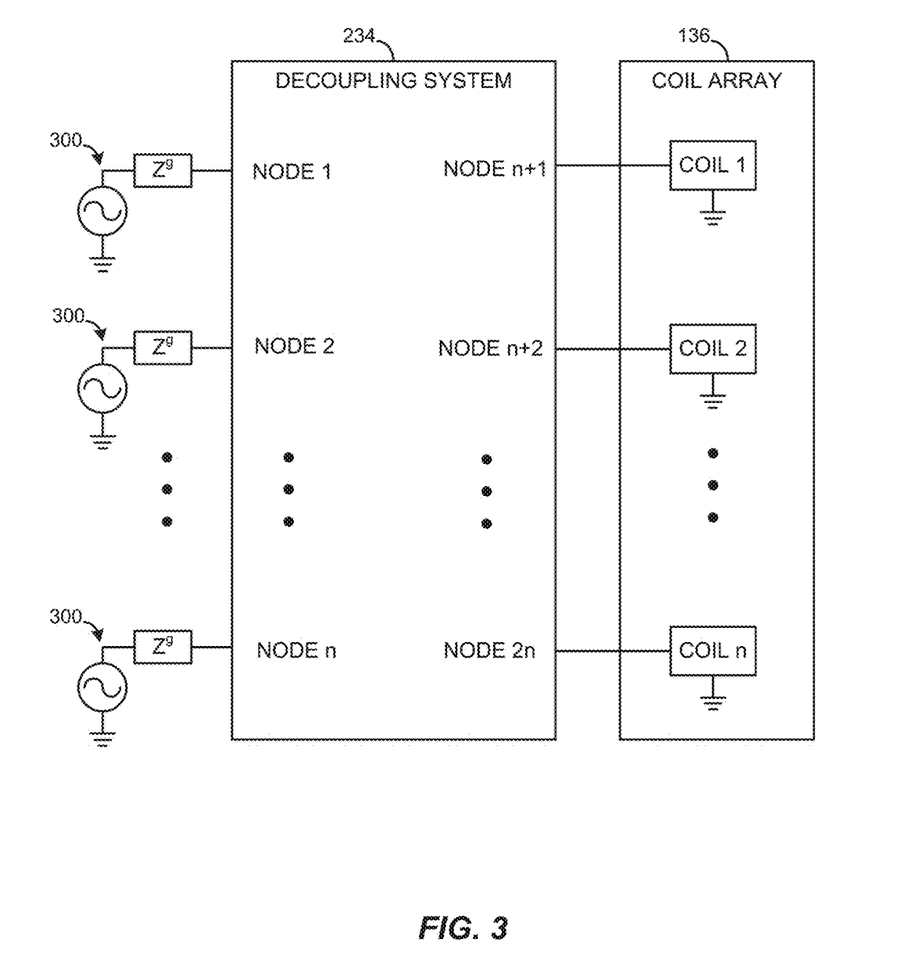
FIG. 3 is a block diagram of a plurality of channels of the parallel transmission architecture of FIG. 2 to show a decoupling system of the parallel transmission architecture of FIG. 2 configured in accordance with one embodiment.

FIG. 3 depicts the decoupling system 234 in accordance with one embodiment in greater detail. The decoupling system 234 couples N channels (e.g., 16 channels) to an equal number of coils in the coil array 136. Each channel has a respective transmitter 300. Each transmitter 300 may include one or more of the components shown in FIG. 2, such as the transmitter 200 and the circulator 230. The components of each transmitter 300 are collectively represented as a voltage source (or generator) and an impedance Zg (e.g., 50 Ohms). Without any coupling between the channels, each respective coil of the coil array 136 would only be coupled to a respective one of the impedances Zg. The decoupling system 234 may be configured to remove such coupling as described below.

The decoupling system 234 has N ports for the nodes on an input side and N ports for the nodes on an output side for a total of 2N ports. The decoupling system 234 is configured as a 2N port network. In this example, node 1 through node n are on the input side and node n+1 through node 2*n* are on the output side.

The resulting decoupling system 234 is customized for a given coil array. Connecting the decoupling system 234 to the transmitters 200 and the coil array 136 as shown in FIG. 3 removes the coupling presented by the coil array 136.

Figure 4:
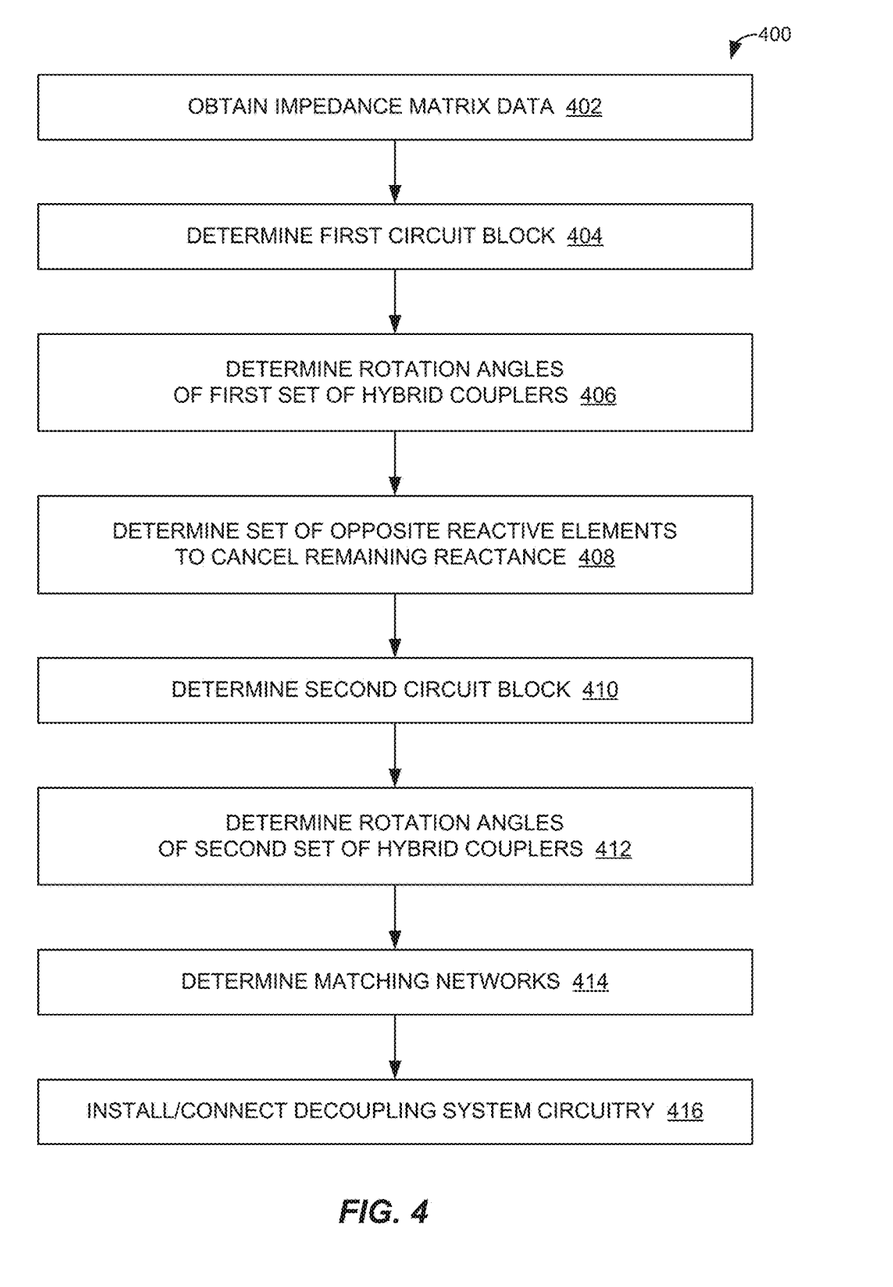
FIG. 4 is a flow diagram of a method of configuring a parallel transmission MRI system with a decoupling system in accordance with one embodiment.

FIG. 4 depicts a method of configuring a parallel transmission MRI system with a decoupling system for an array of coils of the parallel transmission MRI system. The method determines or defines a decoupling matrix of the decoupling system, such as the decoupling matrix described above.

The decoupling condition described herein involves diagonalization of the fully dense complex matrix presented by the coil array. As described below, the impedance matrix of the coil array is diagonalized via a multiplication with its eigenvectors and implemented via hybrid couplers.

The method is computer-implemented. For example, the method may be implemented by the workstation 110 (FIG. 1). One or more acts of the method may thus be implemented with the processor 116 (FIG. 1). Other workstations, computers, or other computing systems may be used. Computer-executable instructions to be executed by the processor(s) of such computing systems to implement the method may be stored on one or more computer-readable storage media. For example, such instructions may be stored in a memory and/or storage device of the workstation 110, the data store server 124 (FIG. 1), or any other memory and/or storage device.

The order of the acts may vary. For example, the rotation angles of the sets of hybrid couplers may be determined at any time after the corresponding circuit blocks are determined. Additional, fewer, or alternative acts may be implemented. For example, the method may not include a matching network determination.

The method may begin in an act 402 in which impedance matrix data for a given array of coils without the decoupling system (e.g., the impedance matrix Z described above) is received, accessed, or otherwise obtained. In some embodiments, the impedance matrix data may be determined from coupling measurement data for the array. One or more simulations or other measurements may be conducted. In other cases, the impedance matrix data may be accessed from a data store.

In an act 404, a first circuit block (or decoupling stage), $S_A$, is determined that diagonalizes a reactive (or imaginary) component $X_C$ of the impedance matrix. The circuit block of the first decoupling stage may be connected to the nodes that lead to the coil array. The circuit block $S_A$ has an S-parameter matrix at the operating frequency (e.g., the Larmor frequency) of the following form:

$$S_A = \begin{bmatrix} 0 & A \\ A^T & 0 \end{bmatrix},$$

where A is an orthogonal matrix comprised of the eigenvectors of $X_C$. That is, the circuit block of the first decoupling stage may thus be configured such that the columns of the orthogonal matrix A are the eigenvectors of $X_C$. Consequently, the first decoupling stage diagonalizes the imaginary part, $X_C$. The resulting intermediate impedance matrix at the output of first decoupling stage may then be expressed as $Z_I = A(Z_C)A^T = R_I + jD_X$, where $R_I = AR_C A^T$ and $D_X$ is a diagonal matrix with the eigenvalues of $X_C$.

Unequal divide hybrid couplers may be used to implement the first decoupling stage. For example, the scattering parameter (S-parameter) matrix of a two-channel (4-ports) 180-degree hybrid coupler with an unequal divide ratio may be used to implement the first decoupling stage. Each hybrid coupler may be implemented via transmission lines of varying lengths. In the example of FIG. 4, rotation angles of a first set of hybrid couplers are determined in an act 406 to implement the first decoupling stage. Other hybrid coupler arrangements may be used, including, for instance, those that rely on one or more 90-degree hybrid couplers.

Figure 7:
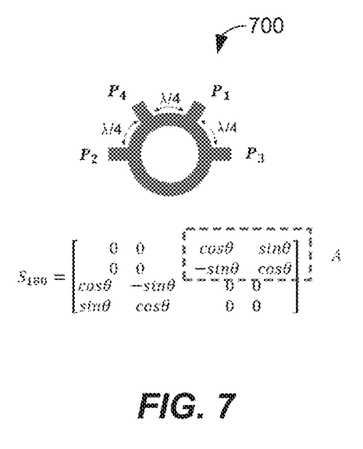
FIG. 7 is a schematic diagram and matrix representation of a 180 degree hybrid coupler of the decoupling system of FIG. 5 in accordance with one embodiment.

An example of a 180-degree hybrid coupler 700 is shown in FIG. 7 along with a representation of the S-parameter matrix $S_{180}$. The S-parameter matrix is a rotation matrix. A series of such rotations matrices, known as Givens rotations, may thus be computed to diagonalize the matrix (e.g., via computation of the singular value decomposition of the matrix). The angle θ referenced in FIG. 7 is the rotation angle and may be computed from the standard singular value decomposition algorithm via Givens rotations. The rotation angle may be the parameter determinative of the unequal split introduced by the hybrid coupler. In some cases, the rotation angle reflects the differences of the weight of the conductive traces used to implement the transmission lines of the hybrid coupler. The rotation angle may thus be indicative of the respective impedances of the transmission lines of the hybrid coupler. The rotation may be implemented by the ratio of the impedances of the hybrid coupler 700. The impedances of the various transmission line sections between the ports of the hybrid coupler 700 may be expressed and determined as follows:

$Z_{0A}$—the transmission line section between ports P1 and P4

$Z_{OA}$—the transmission line section between ports P2 and P3

$Z_{OB}$—the transmission line section between ports P2 and P4

$Z_{OB}$—the transmission line section between ports P1 and P3 where, $$Z_{0A} = Z_0 \sqrt{\frac{1+\gamma}{\gamma}}$$

$$Z_{0B} = Z_0 \sqrt{1+\gamma}$$

$$\gamma = \left(\frac{\sin\theta}{\cos\theta}\right)^2$$

The S-parameter matrix for the 180-degree hybrid coupler 700 includes a multiplication by $-j$ (not shown in FIG. 7), which may be removed by a series connection of transmission lines with length equal to 270 degrees at each input port.

The first decoupling stage results in a diagonal reactance matrix, $jD_X$, which may be eliminated by a second decoupling stage involving a series connection of opposite reactive elements. In the example of FIG. 4, a set of reactive elements is determined in an act 408. The reactive elements are configured to cancel the reactance remaining after the diagonalization of the reactive component. For example, a reactive element opposite of the diagonal reactive component at the operating frequency (e.g., the Larmor frequency) may be selected for each channel (or coil). The reactive element may be a capacitance or inductance. Cancellation of the diagonal reactance matrix, $jD_X$, leaves the resistive component of the impedance matrix after diagonalization of the reactive component, i.e., the dense real matrix $R_I$.

In an act 410, a second circuit block (or third decoupling stage) is determined that diagonalizes the resistive component, the dense real matrix $R_I$. The diagonalization may be conducted in a manner similar to that described above in connection with the first circuit block. For instance, the third decoupling stage may be a circuit block having an S-parameter matrix at the operating frequency given by:

$$S_B = \begin{bmatrix} 0 & B \\ B^T & 0 \end{bmatrix},$$

such that the columns of the matrix B are the eigen vectors of the eigen vectors of $R_I$. As a result, the circuit block diagonalizes the dense real matrix $R_I$ as follows:

$$Z_{III} = B(R_I)B^T = D_R.$$

The matrix $D_R$ is a diagonal matrix with the eigen values of $R_I$.

The rotation angles of a second set of hybrid couplers to implement the second circuit block may then be determined in an act 412. The second set of hybrid couplers are configured to diagonalize $R_I$ by implementing the orthogonal matrix B.

The impedance presented after the third decoupling stage (or second circuit block) is a diagonal resistance matrix. At this point, the coils are completely decoupled, but the coils are not matched to the sources (e.g., the transmitters).

In an act 414, a fourth decoupling stage is determined to match the diagonal matrix to the impedance of power amplifiers or transmitters (e.g., 50Ω). A variety of different single port matching networks may be used to individually match each of the diagonal entries in $R_I$ to the output impedance of the corresponding power amplifier. For example, quarter wavelength transformers, T-, π-, or L-type matching networks may be used.

The resulting decoupling matrix may then be used to configure the MRI system for the given coil array. For example, in an act 416, decoupling system circuitry is installed or connected in accordance with the four stages of the decoupling system. The manner in which the hybrid couplers and other components of the decoupling system circuitry are realized may vary. In one example, each hybrid coupler is fabricated on an FR-4 substrate. Other substrates and circuit constructions may be used.

Figure 5:
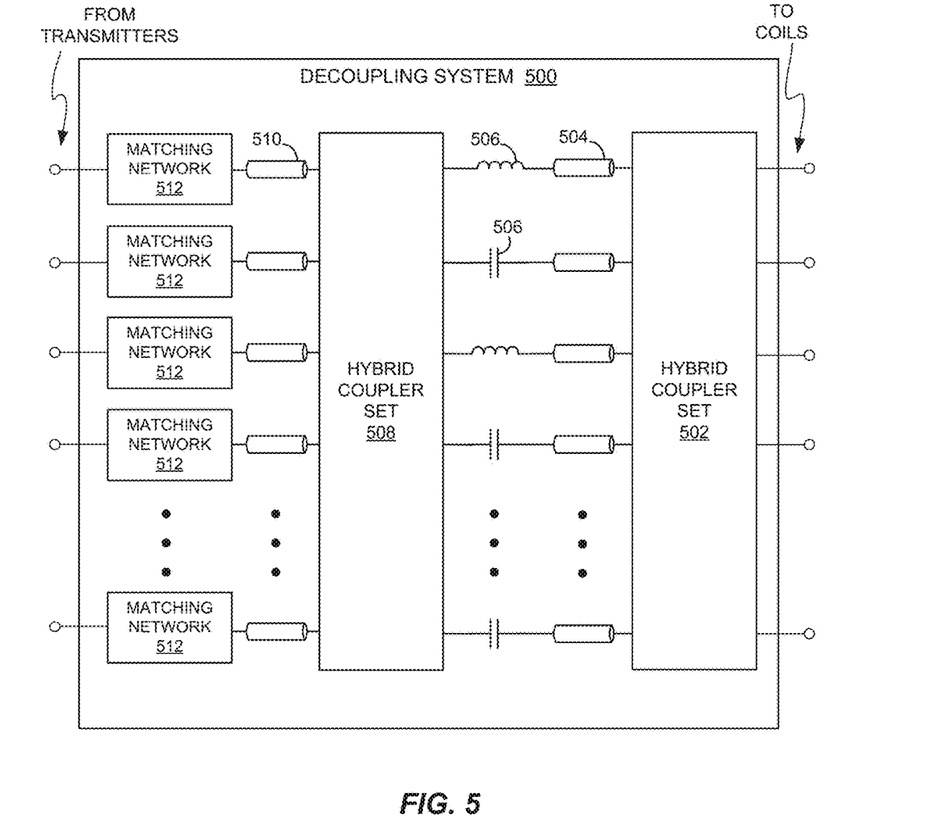
FIG. 5 is a block diagram of a decoupling system having a plurality of hybrid couplers in accordance with one embodiment.

FIG. 5 depicts an exemplary decoupling system 500. The components of the decoupling system 500 may be configured via the method described above in connection with FIG. 4. The decoupling system 500 may be incorporated into the MRI system 100 of FIG. 1, as well as the RF system shown in FIG. 2 and the channels shown in FIG. 3. The decoupling system 500 includes a number of component stages arranged in a number of channels between the nodes leading to a coil array and from a set of transmitters. In this example, the component stages include a first set 502 of hybrid decouplers, a set of transmission lines 504, a plurality of reactive elements 506, a second set 508 of hybrid couplers, and a second set of transmission lines 510.

Each hybrid coupler of the first and second sets 502, 508 of hybrid couplers is coupled to a respective pair of the plurality of transmitters and to a respective pair of the array of coils. For an N-channel array, each set 502, 508 may include N(N−1)/2 hybrid couplers. The maximum number of hybrid couplers is thus N(N−1). Fewer hybrid couplers may be used in some cases. For instance, some coil pairs may not be sufficiently coupled to warrant decoupling. A hybrid coupler may not be included for such coil pairs (and corresponding transmitters). As a result, at least one pair of the plurality of transmitters (or the coils) is not coupled by one of the plurality of hybrid couplers. A lower number of hybrid couplers may result in similar performance while lowering costs and power dissipation in the hybrid couplers.

The hybrid couplers of the first set 502 are configured to diagonalize a reactive part of an impedance matrix of the plurality of coils, as described above in connection with FIG. 4. The plurality of reactive elements 506 couple the first set 502 of hybrid couplers to the second set 508 of hybrid couplers. The plurality of reactive elements 506 are configured to cancel reactance remaining after diagonalization by the first set 502 of hybrid couplers. The plurality of reactive elements 506 may include various inductances and capacitances, as warranted for each channel. The respective reactance is opposite to a reactance remaining for each coil after diagonalization via the first set 502 of hybrid couplers. The magnitude of each reactance may be equal or substantially equal to the remaining reactance. In this example, the reactive elements 506 are connected in series with the first and second sets 502, 508 of hybrid couplers. A respective reactance is presented for each coil or channel. The hybrid couplers of the second set 508 are configured to diagonalize the resistance remaining after cancellation of the reactance component, as described above in connection with FIG. 4.

Each hybrid coupler of the first and second sets 502, 508 may be configured as an unequal division hybrid coupler. In the example of FIG. 4, each hybrid coupler of the first and second sets 502, 508 is configured as a 180-degree hybrid coupler. Other types of hybrid couplers and hybrid coupler arrangements may be used, including, for instance, those involving 90-degree hybrid couplers.

The decoupling system 500 may also include a plurality of single port impedance matching networks 512. A respective one of the matching networks 512 is provided for each channel. Each matching network 512 may thus be connected to a respective node from one of the transmitters. Each matching network 512 may be configured to match an impedance remaining for each coil of the array of coils after diagonalization via the second set 508 of hybrid couplers to an impedance of each transmitter. Each match may be an exactly equal match or a substantially equal match.

The first and second sets 504, 510 of transmission lines are coupled to the first and second sets 502, 508 of hybrid couplers, respectively. Each transmission line of the first and second sets 504, 510 has a length that corresponds with three-fourths of a wavelength of the parallel transmission RF pulse. Each transmission line is coupled to one or more hybrid couplers of the plurality of hybrid couplers. For example, a respective one of the transmission lines may be provided for each channel to address the −j term introduced by the set 502 of hybrid couplers. Another one of the transmission lines may then be provided for each channel to address the −j term introduced by the set 508 of hybrid couplers. In such cases, the number of transmission lines in each set 504, 510 corresponds with the number of channels. In other cases, a separate transmission line may be provided for each input port of the hybrid couplers. The transmission line may thus be incorporated into the circuit implementing the hybrid coupler. The transmission lines of the first and second sets 504, 510 may precede or follow the respective hybrid coupler set 502, 508.

Figure 6:
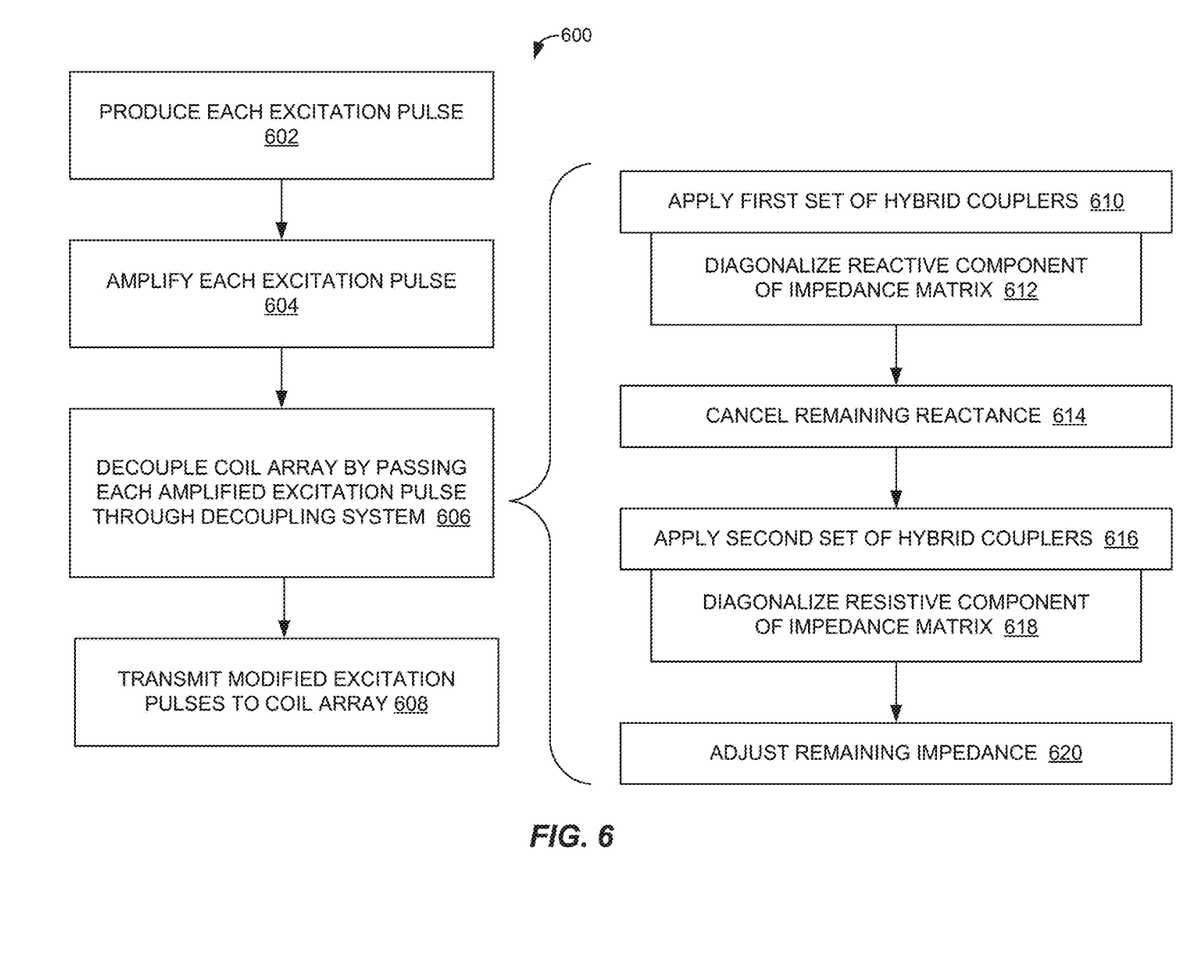
FIG. 6 is a flow diagram of a method of decoupling an array of coils of a parallel transmission MRI system in accordance with one embodiment.

FIG. 6 depicts a method 600 of decoupling an array of coils of a parallel transmission magnetic resonance imaging (MRI) system. The method is computer-implemented. For example, the method may be implemented by the workstation 110 (FIG. 1). One or more acts of the method may thus be implemented with the processor 116 (FIG. 1). Other workstations, computers, or other computing systems may be used. Computer-executable instructions to be executed by the processor(s) of such computing systems to implement the method may be stored on one or more computer-readable storage media. For example, such instructions may be stored in a memory and/or storage device of the workstation 110, the data store server 124 (FIG. 1), or any other memory and/or storage device.

The order of the acts may vary. For example, the order of the acts involved in decoupling the coils may be considered to be implemented in any order. The components of the decoupling system act upon the excitation pulses concurrently. Additional, fewer, or alternative acts may be implemented. For example, the method may not include an impedance adjustment to match the impedance of the transmitters.

The method may begin in an act 602 in which an excitation pulse is produced for each coil of the array of coils. Each pulse may be produced as described above in connection with FIG. 2. Each excitation pulse may then be amplified in an act 604 with a respective amplifier of a plurality of amplifiers. Each amplifier may be provided as part of a respective transmitter of a plurality of transmitters as described in connection with FIG. 2.

In an act 606, each amplified excitation pulse is passed through a decoupling system to decouple the array of coils. The decoupling system includes a plurality of hybrid couplers, each hybrid coupler of the plurality of hybrid couplers being coupled to a respective pair of the plurality of amplifiers and to a respective pair of the array of coils, as described above. Once modified by the decoupling system, the excitation pulses may then be transmitted to the coil array in an act 608.

Passing each amplified excitation pulse includes diagonalizing, with the plurality of hybrid couplers, an impedance matrix of the plurality of coils. In the example of FIG. 6, the plurality of hybrid couplers includes first and second sets respectively applied to diagonalize different components of the impedance matrix. The first of hybrid couplers is applied in an act 610. The first set may thus diagonalize in an act 612 a reactive component of the impedance matrix.

The decoupling of the act 606 may also include cancelling the reactance remaining for each coil after the diagonalization provided by the first set of hybrid couplers. The cancellation may be implemented with a plurality of reactive elements of the decoupling system. The reactive elements may be connected in series with the first and second sets of hybrid couplers.

The second set of hybrid couplers is applied in an act 616. The decoupling of the act 606 may thus further include diagonalizing in an act 618 a resistive component of the impedance matrix remaining after diagonalization of the reactive component.

The act 606 may still further include an act 620 in which an impedance remaining for each coil of the array of coils after diagonalization via the second set of hybrid couplers is adjusted to match an impedance of each transmitter. The act 620 may be implemented with a variety of different single port matching networks, as described above.

The disclosed embodiments present a framework for decoupling and matching parallel MRI transmit arrays operating at high frequencies (e.g., the Larmor frequency). The framework establishes an automated procedure that decouples transmit arrays of an arbitrary number of channels. The framework is thus scalable to any number of transmit channels. The framework is also independent of the geometrical configuration of the coil array.

The decoupling provided by the disclosed embodiments may create orthogonal modes of excitation. The voltage transformation of the decoupling may thus be considered full rank. The disclosed embodiments may thus retains all of the degrees of freedom of the coil array for advantageous transmit pulse design.

The decoupling may be achieved at the cost of only a small insertion loss. The insertion loss may depend on the operating frequency and the dielectric loss tangent of the substrate of the transmission lines of the hybrid couplers.

The disclosed embodiments may provide the decoupling with at most N(N−1) unequal divide hybrid couplers. The decoupling provided by the hybrid couplers is robust to variations in load. The decoupling is also insensitive to variations in component values.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A magnetic resonance imaging (MM) system comprising:
    a plurality of transmitters to generate a parallel transmission radio frequency (RF) pulse;
    an array of coils coupled to the plurality of transmitters to apply the parallel transmission RF pulse to a subject; and a decoupling system connected to the plurality of transmitters and the array of coils;
wherein the decoupling system comprises a plurality of hybrid couplers, each hybrid coupler of the plurality of hybrid couplers being coupled to a respective pair of the plurality of transmitters and to a respective pair of the array of coils; and
wherein the plurality of hybrid couplers are configured to diagonalize an impedance matrix of the plurality of coils.

2. The MM system of claim 1, wherein each hybrid coupler of the plurality of hybrid couplers is configured as an unequal division hybrid coupler.

3. The MM system of claim 1, wherein each hybrid coupler of the plurality of hybrid couplers is configured as a 180 degree hybrid coupler.

4. The MM system of claim 1, wherein the plurality of hybrid couplers comprises:
a first set of hybrid couplers configured to diagonalize a reactive component of the impedance matrix; and
a second set of hybrid couplers configured to diagonalize a resistive component of the impedance matrix after diagonalization of the reactive component.

5. The MM system of claim 4, wherein:
the decoupling system further comprises a plurality of reactive elements;
the plurality of reactive elements are connected in series with the first and second sets of hybrid couplers;
the plurality of reactive elements are configured to present a respective reactance for each coil of the array of coils;
the respective reactance is opposite a reactance remaining for each coil after diagonalization via the first set of hybrid couplers.

6. The MM system of claim 4, wherein:
the decoupling system further comprises a plurality of single port impedance matching networks; and
each single port impedance matching network of the plurality of single port impedance matching networks is configured to match an impedance remaining for each coil of the array of coils after diagonalization via the second set of hybrid couplers to an impedance of each transmitter of the plurality of transmitters.

7. The MM system of claim 1, wherein:
the decoupling system further comprises a plurality of transmission lines;
each transmission line of the plurality of transmission lines is coupled to at least one of the plurality of hybrid couplers; and
each transmission line has a length that corresponds with three-fourths of a wavelength of the parallel transmission RF pulse.

8. The MM system of claim 1, wherein the decoupling system is configured such that at least one pair of the plurality of transmitters is not coupled by one of the plurality of hybrid couplers.

9. A method of decoupling an array of coils of a parallel transmission magnetic resonance imaging (MM) system, the method comprising:
producing an excitation pulse for each coil of the array of coils;
amplifying each excitation pulse with a respective amplifier of a plurality of amplifiers; and
passing each amplified excitation pulse through a decoupling system to decouple the array of coils, the decoupling system comprising a plurality of hybrid couplers, each hybrid coupler of the plurality of hybrid couplers being coupled to a respective pair of the plurality of amplifiers and to a respective pair of the array of coils;
wherein the plurality of hybrid couplers are configured to diagonalize an impedance matrix of the plurality of coils.

10. The method of claim 9, wherein each hybrid coupler of the plurality of hybrid couplers is configured as an unequal division hybrid coupler.

11. The method of claim 9, wherein each hybrid coupler of the plurality of hybrid couplers is configured as a 180 degree hybrid coupler.

12. The method of claim 9, wherein:
the plurality of hybrid couplers comprises first and second sets of hybrid couplers; and
diagonalizing the impedance matrix comprises diagonalizing a reactive component of the impedance matrix with the first set of hybrid couplers; and
passing each amplified excitation pulse further comprises diagonalizing a resistive component of the impedance matrix remaining after diagonalization of the reactive component.

13. The method of claim 12, wherein passing each amplified excitation pulse further comprises cancelling a reactance remaining for each coil after diagonalization via the first set of hybrid couplers with a plurality of reactive elements of the decoupling system connected in series with the first and second sets of hybrid couplers.

14. The method of claim 12, wherein passing each amplified excitation pulse further comprises adjusting an impedance remaining for each coil of the array of coils after diagonalization via the second set of hybrid couplers to match an impedance of each transmitter of the plurality of transmitters.

15. The method of claim 9, wherein at least one pair of the plurality of transmitters is not coupled by one of the plurality of hybrid couplers.

16. A magnetic resonance imaging (MRI) system comprising:
a plurality of transmitters to generate a parallel transmission radio frequency (RF) pulse;
an array of coils coupled to the plurality of transmitters to apply the parallel transmission RF pulse to a subject; and
a decoupling system connected to the plurality of transmitters and the array of coils;
wherein the decoupling system comprises:
first and second sets of hybrid couplers, each hybrid coupler of the first and second sets of hybrid couplers being coupled to a respective pair of the plurality of transmitters and to a respective pair of the array of coils; and
a plurality of reactive elements coupling the first set of hybrid couplers to the second set of hybrid couplers;
wherein the first set of hybrid couplers are configured to diagonalize a reactive part of an impedance matrix of the plurality of coils,
wherein the plurality of reactive elements are configured to cancel reactance remaining after diagonalization by the first set of hybrid couplers, and
wherein the second set of hybrid couplers are configured to diagonalize resistance remaining after cancellation of the reactance.

17. The MM system of claim 16, wherein each hybrid coupler of the plurality of hybrid couplers is configured as a 180 degree hybrid coupler.

18. The MM system of claim 16, wherein the decoupling system is configured such that at least one pair of the plurality of transmitters is not coupled by the first and second sets of hybrid couplers.

19. The method of claim 9, wherein:
the plurality of hybrid couplers comprises a first set of hybrid couplers configured to diagonalize a reactive component of the impedance matrix via rotation angles of the first set of hybrid couplers; and
the plurality of hybrid couplers comprises a second set of hybrid couplers configured to diagonalize a resistive component of the impedance matrix after diagonalization of the reactive component via rotation angles of the second set of hybrid couplers.

20. The method of claim 19, wherein the decoupling system comprises a set of reactive elements to cancel the reactive component remaining after the diagonalization of the reactive component.

* * * * *

UNITED STATES PATENT AND TRADEMARK OFFICE
CERTIFICATE OF CORRECTION

PATENT NO. : 10,197,646 B2  
APPLICATION NO. : 14/705576  
DATED : February 5, 2019  
INVENTOR(S) : Elfar Adalsteinsson et al.

It is certified that error appears in the above-identified patent and that said Letters Patent is hereby corrected as shown below:

In the Claims

Column 14, Line 61 Claim 1. "(MM)" – Should be replaced with – "(MRI)"

Column 15, Line 11 Claim 2. "(MM)" – Should be replaced with – "(MRI)"

Column 15, Line 14 Claim 3. "(MM)" – Should be replaced with – "(MRI)"

Column 15, Line 17 Claim 4. "(MM)" – Should be replaced with – "(MRI)"

Column 15, Line 24 Claim 5. "(MM)" – Should be replaced with – "(MRI)"

Column 15, Line 34 Claim 6. "(MM)" – Should be replaced with – "(MRI)"

Column 15, Line 43 Claim 7. "(MM)" – Should be replaced with – "(MRI)"

Column 15, Line 52 Claim 8. "(MM)" – Should be replaced with – "(MRI)"

Column 15, Line 57 Claim 9. "(MM)" – Should be replaced with – "(MRI)"

Column 16, Line 63 Claim 17. "(MM)" – Should be replaced with – "(MRI)"

Column 16, Line 65 Claim 18. "(MM)" – Should be replaced with – "(MRI)"

Signed and Sealed this  
Fourteenth Day of May, 2019

Andrei Iancu  
*Director of the United States Patent and Trademark Office*